(12) United States Patent
Kim et al.

(10) Patent No.: US 7,964,944 B2
(45) Date of Patent: Jun. 21, 2011

(54) SYSTEM ON PACKAGE OF A MOBILE RFID INTERROGATOR

(75) Inventors: Joungho Kim, Daejeon (KR); Yujeong Shim, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 1086 days.

(21) Appl. No.: 11/741,946

(22) Filed: Apr. 30, 2007

(65) Prior Publication Data

US 2007/0285211 A1    Dec. 13, 2007

(30) Foreign Application Priority Data

May 11, 2006   (KR) .................. 10-2006-0042346

(51) Int. Cl.
*H01L 21/98*    (2006.01)
*H01L 23/52*    (2006.01)

(52) U.S. Cl. ........ 257/679; 257/678; 257/692; 257/728; 257/E23.001; 257/E23.01; 343/872; 343/873; 455/280

(58) Field of Classification Search .................. 257/728
See application file for complete search history.

(56) References Cited

U.S. PATENT DOCUMENTS

| 6,977,428 | B2 * | 12/2005 | Nakamura ..................... 257/678 |
| 7,035,081 | B2 * | 4/2006 | Nagata et al. .............. 361/306.3 |
| 2004/0169198 | A1 * | 9/2004 | Nagata et al. ................. 257/200 |
| 2006/0033664 | A1 * | 2/2006 | Soler Castany et al. ...... 343/700 MS |

* cited by examiner

*Primary Examiner* — Leonardo Andújar
*Assistant Examiner* — William Harriston
(74) *Attorney, Agent, or Firm* — Daly, Crowley, Mofford & Durkee, LLP

(57) ABSTRACT

The present invention is to implement a SOP of a mobile RFID interrogator. The substrate has external connection terminal patterns on a first surface of a substrate and circuit wiring patterns on a second surface of the substrate. a high frequency front-end part, a power amplifier IC, an analog-digital signal processing chip and the like are mounted on the second surface. The high frequency front-end part is to transmit and receive a RFID signal. The power amplifier IC is to output an amplified high frequency transmission signal to the high frequency front-end part. The analog-digital signal processing chip is to output a high frequency transmission signal to the power amplifier IC and process the RFID signal received through the high frequency front-end part, a mold resin is to cover the second surface and components mounted on the second surface for electrical insulation from outside and physical protection from outside.

4 Claims, 3 Drawing Sheets

| G | G | G | G | G | G | G | G | G | G | G |
|---|---|---|---|---|---|---|---|---|---|---|
| G | P_RF_i+ | P_RF_i− | G | PA_O+ | PA_O− | G | G | DIV | G | VCO | G |

SYSTEM ON PACKAGE OF A MOBILE RFID INTERROGATOR

CROSS-REFERENCE TO RELATED APPLICATIONS

This application claims priority under 35 USC §119 to Korean Patent Application No. 2006-0042346, filed on May 11, 2006 in the Korean Intellectual Property Office (KIPO), the disclosure of which is incorporated herein in its entirety by reference.

BACKGROUND OF THE INVENTION

1. Field of the Invention

The present invention relates to a system on package (SOP), and more particularly to a SOP of a mobile radio frequency identification (RFID) interrogator to be built in a mobile terminal system of 900 MHz frequency band.

2. Description of the Related Art

Generally, a RFID interrogator (or a RFID reader) is implemented in portable or fixed type. The RFID interrogator supplies electric power to a RFID tag and interrogates a RFID code received from a RFID tag. A frequency band may be classified into 125 kHz, 134 kHz, 13.56 MHz, 433 MHz, 900 MHz, 2.45 GHz and 5.8 GHz according to the frequency band that a RFID interrogator uses.

Recently, researches about RFID techniques of 900 MHz frequency band that is similar with the frequency band for a mobile product such as a cellular phone are actively advanced.

Currently, most RFID interrogators of 900 MHz frequency band are fixed-type interrogators that are based on a patch antenna. Companies such as ALIEN or AWID manufacture independent-type interrogators that are based on an internal antenna. The interrogators for North America adopting the FCC Standards in which 902~928 MHz frequency band and frequency hopping spread spectrum (FHSS) method are mainly used are manufactured owing to Wall-Mart.

Currently, the development of interrogators tends to be advanced toward satisfying the requirements of goods circulation fields including Wall-Mart. Most interrogators include a portable interrogator module and may be classified to a product type for industrial PDA, a PCMCIA type, and a module type according to the form of RFID interrogators. Also, the interrogators may be classified to a battery-internal type and a battery-separate type according to the form of electric power sources. There are differences of battery consumption between a 0.5-watt module and a 1-watt module. The interrogators operate continuously for 1~2 hour(s) in technical level of the present time, and it is difficult to increase a duration time of a battery and efficiency of interrogators.

A module type interrogator, in which a module card is connected to a cellular phone typically has disadvantages such as inconvenience in use and portability because the interrogator is big in size.

As a cellular phone becomes small, light, and slim, a SOP of a RFID interrogator is needed in order to build a RFID interrogator in a cellular phone. In order to implement a small SOP of a RFID interrogator, there are relatively many technical difficulties compared with the module type interrogator that is big in size. For example, there are difficulties with respect to a mix of analog and digital signal processing, a design for reducing power consumption, a design for heat emission adaptable for a small size, and a design for improving signal integrity against increased signal interferences.

SUMMARY OF THE INVENTION

Accordingly, the present invention is provided to substantially obviate one or more problems due to limitations and disadvantages of the related art.

Some embodiments of the present invention provide a SOP of a RFID interrogator that can be implemented in small size.

Some embodiments of the present invention provide a SOP of a RFID interrogator that can reduce interferences between transmission and reception.

Some embodiments of the present invention provide a SOP of a RFID interrogator that can solve heat problems due to small size.

Some embodiments of the present invention provide a SOP of a RFID interrogator that can reduce signal interferences by arranging the terminals efficiently.

In some example embodiments of the present invention, a SOP of a RFID interrogator has external connection terminal patterns on a first surface of a substrate and circuit wiring patterns on a second surface of the substrate. A high frequency front-end part, a power amplifier IC, an analog-digital signal processing chip and the like are mounted on the second surface of the substrate. The high frequency front-end part includes passive components such as an antenna, a band pass filter (BPF) in order to transmit and receive a UHF RFID signal. The power amplifier IC provides an amplified high frequency transmission signal to the high frequency front-end part. Transmission power of the power amplifier IC is relatively strong and thus the power amplifier IC is implemented on a separate chip in order to reduce interferences with other parts. A reception signal has relatively weak intensity compared with a transmission signal in a UHF RFID interrogator in which transmission and reception are performed simultaneously. Therefore, interferences should be reduced between a reception signal and a transmission signal. The analog-digital signal processing chip is implemented on one chip and includes a RF analog part and a digital part that codes and decodes a RFID data. If the analog part and the digital part are integrated on one chip, the size of a RFID interrogator can be reduced by decreasing number of parts that are mounted, and routing of circuit wiring patterns of the substrate can be achieved conveniently. In order to insulate parts and chips that are mounted electrically from outside and protect the parts and the chips physically, the second surface of the substrate is covered with mold resin that builds up a protection layer.

External connection terminal patterns are formed on the first surface of the substrate. The external connection terminal patterns include lattice ground terminal patterns, signal terminal patterns, and power terminal patterns. The lattice ground terminal patterns are formed on a middle portion of the first surface in order to emit heat, and signal terminal patterns and power terminal patterns are formed on a peripheral portion around the middle portion of the first surface. In order to emit heat efficiently in a small package having the size of about 12 mm*12 mm, ground terminals are formed intensively on the middle portion of the first surface in a matrix type. The heat in the small package can be emitted efficiently to outside through the ground terminal patterns that occupy the largest areas among the circuit wiring patterns.

In order to reduce interferences with other signal lines nearby, among the signal patterns that are formed on the peripheral portion, high frequency signal input terminals are surrounded by ground terminal patterns. The high frequency signal input terminals include high frequency differential signal input terminals and high frequency common mode signal input terminals.

The high frequency differential signal input terminals should make fields between the high frequency differential signal lines. If the high frequency differential signal input terminals make fields with other signal lines nearby, interferences can degrade signal integrity. Therefore, the high frequency differential signal input terminals are surrounded by ground terminals in order to block the fields between the high frequency differential signal lines and other signal lines nearby.

The high frequency common mode signal input terminals can make noises due to parasitic elements of a package and a board if return current path is long. Therefore, the high frequency common mode signal input terminals are surrounded by ground terminals nearby, and thus the return current path may be shortened and signal integrity may be improved.

For example, the high frequency signal input terminals can include high frequency reception signal input terminals of the power amplifier IC, phase locked loop clock signal input terminals of the signal processing chip, voltage controlled oscillator input terminals, high frequency reception signal input terminals of the high frequency front-end part, and the like.

DESCRIPTION OF THE EMBODIMENTS

Figure 1:
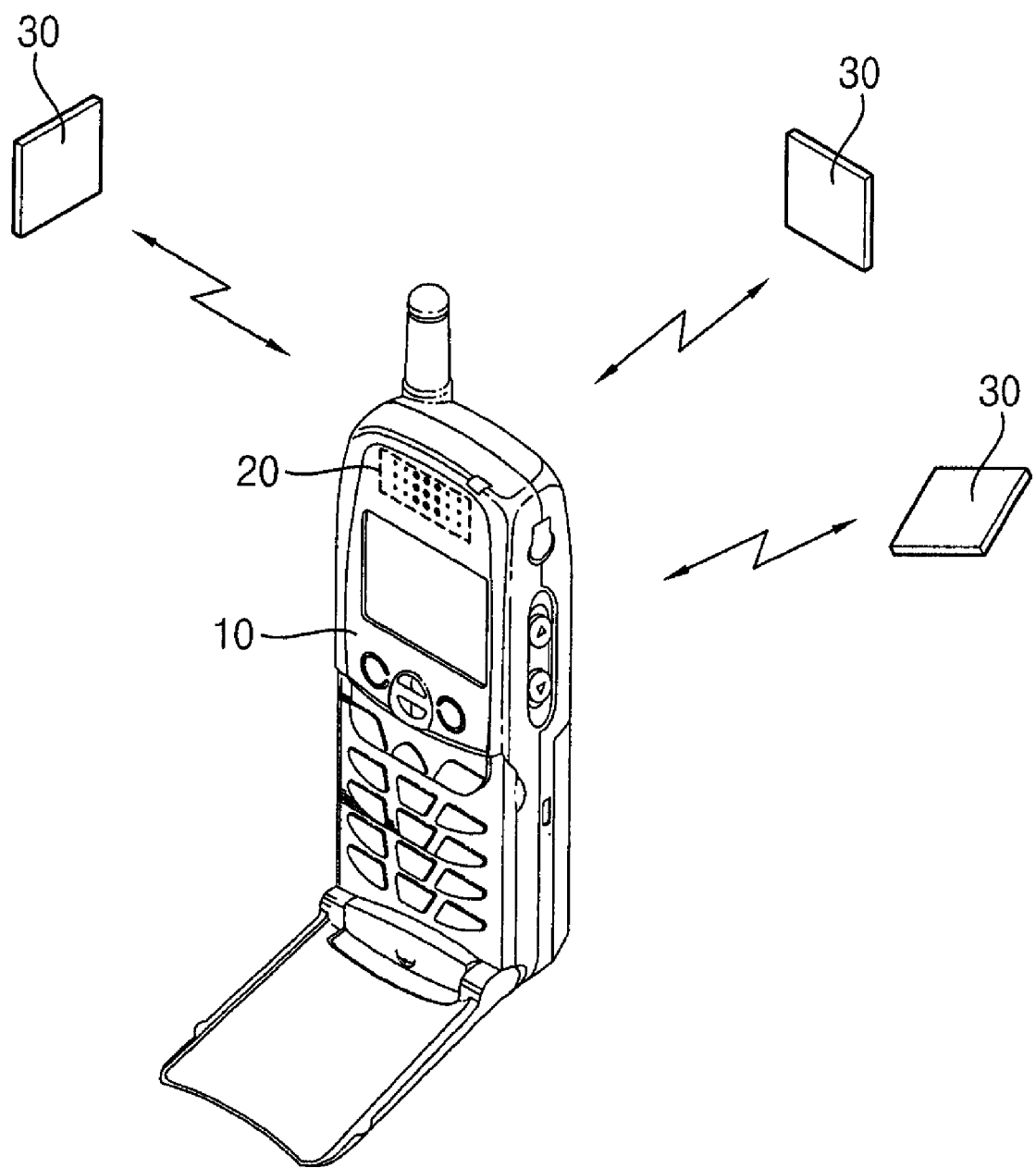
FIG. 1 is a diagram illustrating a mobile RFID system according to an example embodiment of the present invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a mobile RFID system according to an example embodiment of the present invention.

Referring to FIG. 1, a mobile UHF RFID interrogator 20 is manufactured in a system on package (SOP) type and is mounted on a substrate in a cellular phone 10. The interrogator 20 transmits a high frequency signal of 900 MHz frequency band (ISO/IEC 18000-6 Standards), provides electric power to a UHF RFID tag 30, provides a command to the UHF RFID tag 30, and receives a high frequency RFID signal transmitted from the UHF RFID tag 30 at the same time.

Figure 2:
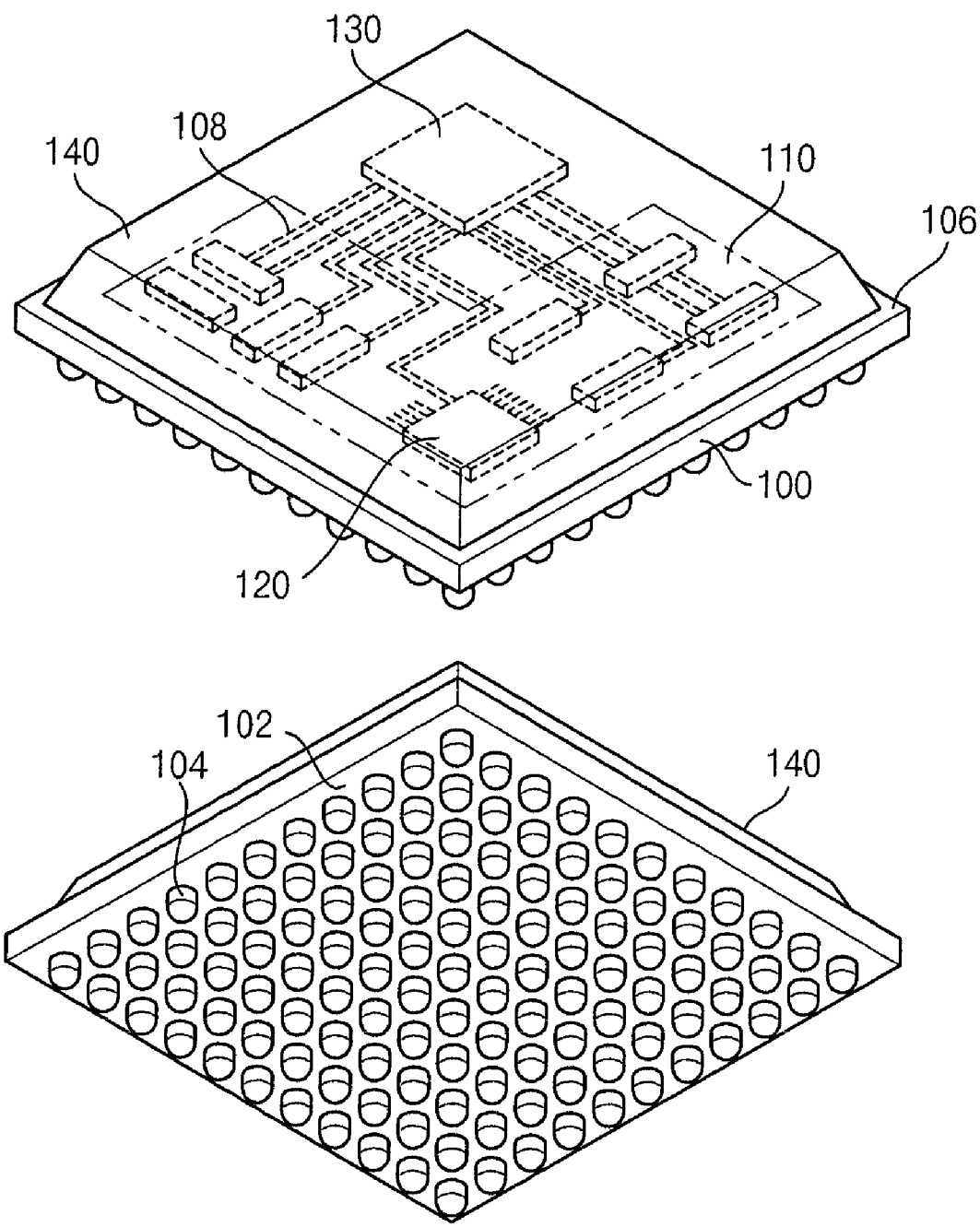
FIG. 2 is a perspective diagram illustrating a SOP of a mobile RFID interrogator according to an example embodiment of the present invention.

FIG. 2 is a perspective diagram illustrating a SOP of a mobile RFID interrogator according to an example embodiment of the present invention.

Referring to FIG. 2, a SOP includes a substrate 100, a high frequency front-end part 110, a power amplifier IC 120, an analog-digital signal processing chip 130, and mold resin 140. External connection terminal patterns 104 are formed on a first surface 102 of the substrate 100 and circuit wiring patterns 108 are formed on a second surface 106 of the substrate 100. The terminals of the first surface 102 are coupled to the circuit wiring of the second surface 106 through VIA contacts (not shown). The terminal patterns 104 of the first surface 102 are arranged in a matrix type and formed in a ball grid array (BGA) type.

Circuit wiring patterns 108 are formed on the second surface 106 of the substrate 100. A high frequency front-end part 110, a power amplifier IC 120, an analog-digital signal processing chip 130, and the like are mounted on the second surface 106 of the substrate 100. The high frequency front-end part includes antenna patterns for transmitting and receiving a UHF RFID signal, resisters constituting a band pass filter (BFP), passive components such as capacitors and inductors, and circulators.

The power amplifier IC 120 provides an amplified high frequency transmission signal to the high frequency front-end part 110. Transmission power of the power amplifier IC 120 is relatively strong and thus the power amplifier IC 120 is implemented on a separate chip in order to reduce interferences with other parts. A reception signal has relatively weak intensity compared with a transmission signal in a UHF RFID interrogator in which transmission and reception are performed simultaneously. Therefore, interferences should be reduced between a reception signal and a transmission signal.

The analog-digital signal processing chip 130 is implemented on one chip and includes a RF analog part and a digital part that codes and decodes a RFID data. The RF analog part includes a RF transmission part, a RF reception part, a frequency synthesis part that includes a phase locked loop (PLL), and the like. The digital part gives an encoded command to the RF transmission part, decodes a received base-band signal, and recognizes and processes the decoded signal. The recognized information may be shown on a display window through a mobile control part and/or may be transmitted to a service center through a transport network. If the analog part and the digital part are integrated on one chip, the size of a RFID interrogator can be reduced by decreasing number of parts that are mounted, and routing of circuit wiring patterns of the substrate can be achieved conveniently.

After these parts and chips are mounted, the second surface 106 of the substrate 100 is covered with mold resin 130 that builds up a protection-layer. The protection-layer insulates the parts and the chips electrically from outside and protects the parts and the chips physically.

Figures 3, 4:
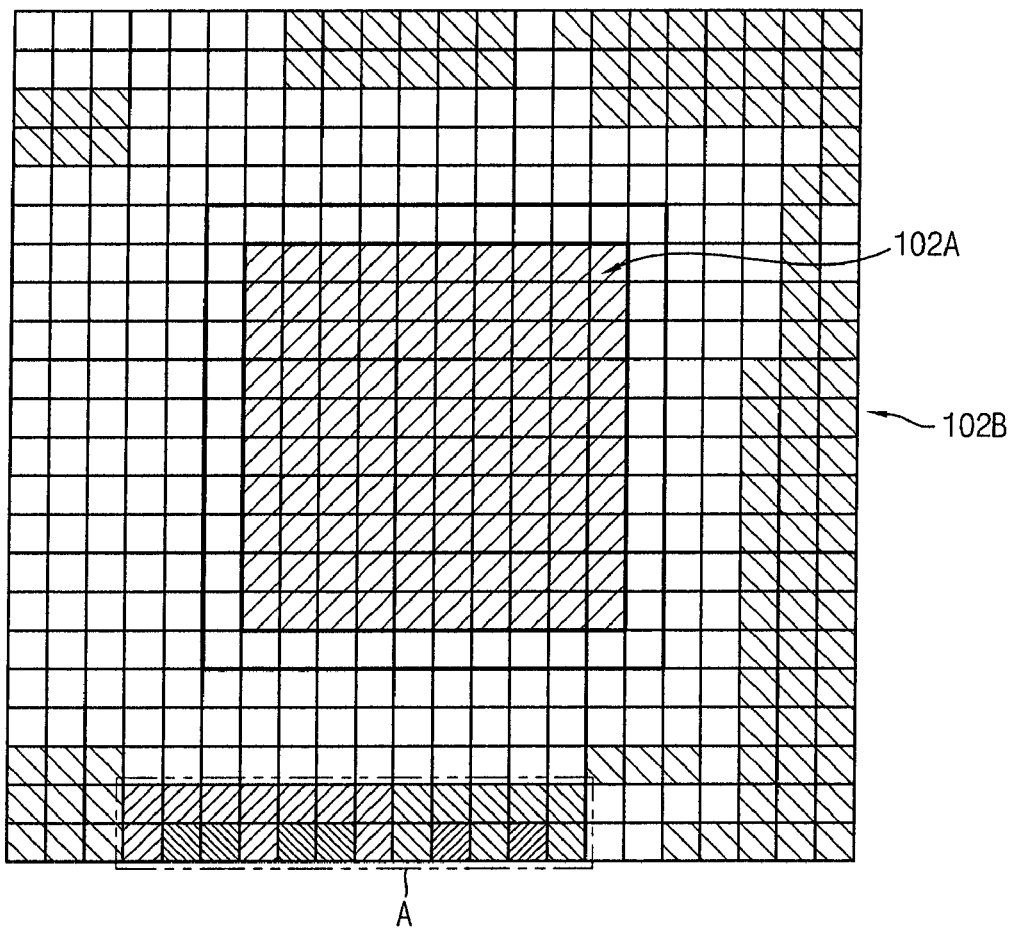
FIG. 3 is a diagram illustrating an example of terminal patterns arranged on the first surface of the substrate in FIG. 2.
FIG. 4 is a diagram illustrating 'A' part of the terminal patterns in FIG. 3.

FIG. 3 is a diagram illustrating an example of terminal patterns arranged on the first surface 102 of the substrate 100 in FIG. 2, and FIG. 4 is a diagram illustrating A part of the terminal patterns in FIG. 3. External connection terminal patterns 104 are formed on the first surface 102 of the substrate 100. The external connection terminal patterns 104 include lattice ground terminal patterns, signal terminal patterns, and power terminal patterns. The lattice ground terminal patterns are formed on a middle portion 102A (10 terminals column*10 terminals column) of the first surface 102 in order to emit heat, and signal terminal patterns and power terminal patterns are formed on a peripheral portion 102B around the middle portion 102A of the first surface 102. In order to emit heat efficiently in a small package having the size of about 12 mm*12 mm, ground terminals are formed intensively on the middle portion 102A of the first surface 102 in a matrix type. The heat in the small package can be emitted efficiently to outside through the ground terminal patterns that occupy the largest areas among the circuit wiring patterns.

As illustrated in FIG. 4, in order to reduce interferences with other signal lines nearby, among the signal patterns that are formed on the peripheral portion 102B, high frequency signal input terminals are surrounded by ground terminals. The high frequency signal input terminals include high frequency common mode signal input terminals and high frequency differential signal input terminals such as high frequency signal input terminals (P_RF_i+, P_RF_i−) of the power amplifier IC and ground signal input terminals (PA O+, PA O−).

The high frequency differential signal input terminals should make fields between the high frequency differential signal lines. If the high frequency differential signal input terminals make fields with other signal lines nearby, interferences can degrade signal integrity. Therefore, the high frequency differential signal input terminals are surrounded by ground terminals in order to block the fields between the high frequency differential signal lines and other signal lines nearby.

The high frequency common mode signal input terminals (DIV_O, VCO_O) can make noises due to parasitic elements of a package and a board if return current path is long. Therefore, the high frequency common mode signal input terminals are surrounded by ground terminals nearby and thus the return current path may be shortened and signal integrity may be improved.

For example, the high frequency signal input terminals can include high frequency reception signal input terminals of the power amplifier IC, phase locked loop clock signal input terminals of the signal processing chip, voltage controlled oscillator input terminals, high frequency reception signal input terminals of the high frequency front-end part, and the like.

In accordance with example embodiments of the present invention, a SOP of is a mobile RFID interrogator may be implemented in a small size and may reduce interferences between transmission and reception. In addition, the SOP of a mobile RFID interrogator may solve heat problems in a small-sized product, and may reduce signal interferences by arranging the terminals efficiently.

While the example embodiments of the present invention and their advantages have been described in detail, it should be understood that various changes, substitutions and alterations may be made herein without departing from the scope of the invention.

What is claimed is:

1. A system on package (SOP) of a mobile radio frequency identification (RFID) interrogator, comprising:
   a substrate having external connection terminal patterns on a first surface and circuit wiring patterns on a second surface;
   a high frequency front-end part mounted on the second surface and configured to transmit and receive a RFID signal;
   a power amplifier IC mounted on the second surface and configured to output an amplified high frequency transmission signal to the high frequency front-end part;
   an analog-digital signal processing chip mounted on the second surface and configured to output a high frequency transmission signal to the power amplifier IC, and process the RFID signal received through the high frequency front-end part; and
   a mold resin configured to cover the second surface and components mounted on the second surface for electrical insulation of the components from outside and physical protection of the components from outside,
   wherein the external connection terminal patterns comprise:
      lattice ground terminal patterns,
      signal terminal patterns comprising high frequency signal input terminals, and
      power terminal patterns,
   wherein the lattice ground terminal patterns are formed on a middle portion of the first surface in order to emit heat,
   wherein the signal terminal patterns and the power terminal patterns are formed on a peripheral portion around the middle portion of the first surface, and
   wherein each of high frequency signal input terminals formed on the peripheral portion of the first surface are surrounded by ground terminal patterns in order to reduce interferences with other signal lines nearby.

2. The SOP of a mobile RFID interrogator of claim 1, wherein the high frequency signal input terminals include high frequency differential signal input terminals.

3. The SOP of a mobile RFID interrogator of claim 1, wherein the high frequency signal input terminals include high frequency common mode signal input terminals.

4. The SOP of a mobile RFID interrogator of claim 1, wherein the high frequency signal input terminals include high frequency reception signal input terminals of the power amplifier IC, phase locked loop clock signal input terminals of the analog-digital signal processing chip and high frequency reception signal input terminals of the high frequency front-end part.

* * * * *